(12) United States Patent
Xu et al.

(10) Patent No.: US 11,515,285 B2
(45) Date of Patent: Nov. 29, 2022

(54) METHODS OF OPTIMIZING CLAMPING OF A SEMICONDUCTOR ELEMENT AGAINST A SUPPORT STRUCTURE ON A WIRE BONDING MACHINE, AND RELATED METHODS

(71) Applicant: Kulicke and Soffa Industries, Inc., Fort Washington, PA (US)

(72) Inventors: Hui Xu, Chalfont, PA (US); JeongHo Yang, Blue Bell, PA (US); Wei Qin, Ambler, PA (US); Ziauddin Ahmad, Villanova, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 152 days.

(21) Appl. No.: 17/212,395

(22) Filed: Mar. 25, 2021

(65) Prior Publication Data
US 2021/0305199 A1 Sep. 30, 2021

Related U.S. Application Data

(60) Provisional application No. 63/001,415, filed on Mar. 29, 2020.

(51) Int. Cl.
*B23K 20/00* (2006.01)
*H01L 23/00* (2006.01)

(52) U.S. Cl.
CPC .......... *H01L 24/78* (2013.01); *B23K 20/004* (2013.01); *H01L 24/85* (2013.01); *H01L 2224/7892* (2013.01); *H01L 2224/78984* (2013.01)

(58) Field of Classification Search
CPC .......... H01L 24/78; H01L 2224/7892; H01L 2224/78984; H01L 2224/78251;
(Continued)

(56) References Cited

U.S. PATENT DOCUMENTS

| 6,302,317 B1 * | 10/2001 | Narita | H01L 21/67138 228/8 |
| 2001/0013532 A1 * | 8/2001 | Higashi | H01L 24/78 228/49.1 |

(Continued)

FOREIGN PATENT DOCUMENTS

| CN | 110235232 A * | 9/2019 | B23K 20/10 |
| EP | 0502674 A2 * | 9/1992 | |

(Continued)

OTHER PUBLICATIONS

Machine translation of JP 2001-007147A (no date available).*
International Search Report dated Jul. 12, 2021 for International Patent Application No. PCT/US2021/024005.

*Primary Examiner* — Kiley S Stoner
(74) *Attorney, Agent, or Firm* — Christopher M. Spletzer, Sr.

(57) ABSTRACT

A method of adjusting a clamping of a semiconductor element against a support structure on a wire bonding machine is provided. The method includes: (a) detecting an indicia of floating of the semiconductor element with respect to the support structure at a plurality of locations of the semiconductor element; and (b) adjusting the clamping of the semiconductor element against the support structure based on the results of step (a).

14 Claims, 9 Drawing Sheets

(58) Field of Classification Search
CPC ... H01L 2224/78704; H01L 2224/7898; H01L 24/85; B23K 20/004; B23K 20/005; B23K 20/007
USPC ............ 228/180.5, 4.5, 904, 102–105, 8–12
See application file for complete search history.

(56) References Cited

U.S. PATENT DOCUMENTS

| | | | | |
|---|---|---|---|---|
| 2003/0010807 | A1* | 1/2003 | Matthies | H01L 24/81 228/103 |
| 2009/0014501 | A1* | 1/2009 | Nishi | H05K 13/0817 228/103 |
| 2010/0006624 | A1* | 1/2010 | Nakatsuka | B23K 1/0053 228/111.5 |
| 2014/0014708 | A1 | 1/2014 | Chuang et al. | |
| 2015/0083786 | A1* | 3/2015 | Okamoto | H01L 21/67092 228/9 |
| 2017/0062241 | A1* | 3/2017 | Rimbert-Riviere | B23K 1/0016 |

FOREIGN PATENT DOCUMENTS

| | | | | |
|---|---|---|---|---|
| GB | 2304456 A | * | 3/1997 | ....... H01L 21/67144 |
| JP | H0634345 A | * | 2/1994 | |
| JP | H05160232 A | * | 6/1995 | |
| JP | 2000012597 A | * | 1/2000 | ............ H01L 24/78 |
| JP | 2000100858 A | * | 4/2000 | ............ H01L 24/78 |
| JP | 2001-007147 A | | 1/2001 | |
| JP | 2001007147 A | * | 1/2001 | ............ H01L 24/78 |
| JP | 2001203233 A | * | 7/2001 | ............ H01L 24/78 |
| JP | 2001296253 A | * | 10/2001 | ............ H01L 24/78 |
| JP | 2003152013 A | * | 5/2003 | ............ H01L 24/78 |
| JP | 2006156835 A | * | 6/2006 | ............ H01L 24/78 |
| JP | 3796089 B2 | * | 7/2006 | ............ H01L 21/681 |
| JP | 2009038196 A | * | 2/2009 | ............ H01L 24/78 |
| JP | 2009212258 A | * | 9/2009 | ............ H01L 24/85 |
| KR | 10-2004-0092195 A | | 11/2004 | |
| KR | 10-2007-0099992 A | | 10/2007 | |
| KR | 10-2016-0001192 A | | 1/2016 | |
| WO | WO-2016103886 A1 | * | 6/2016 | ........... B23K 20/002 |
| WO | WO-2018110417 A1 | * | 6/2018 | ............ H01L 24/00 |

* cited by examiner

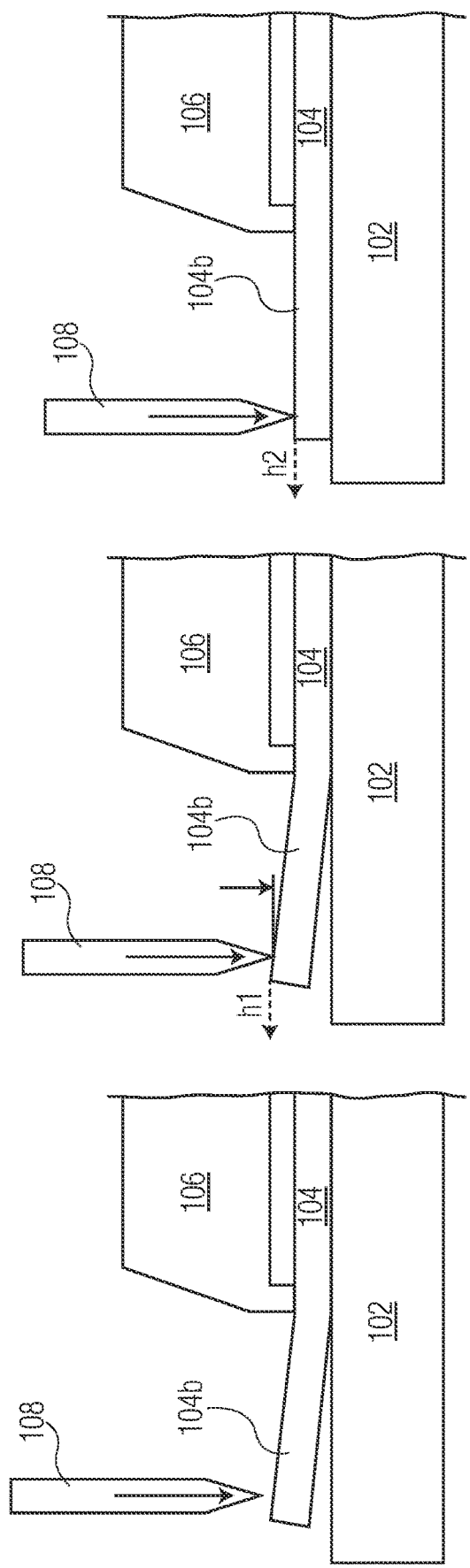

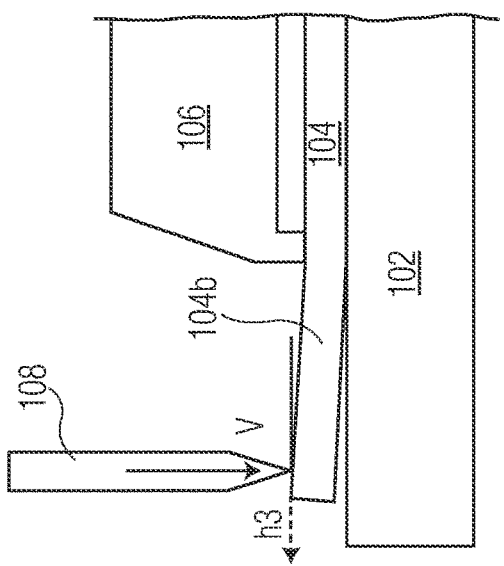
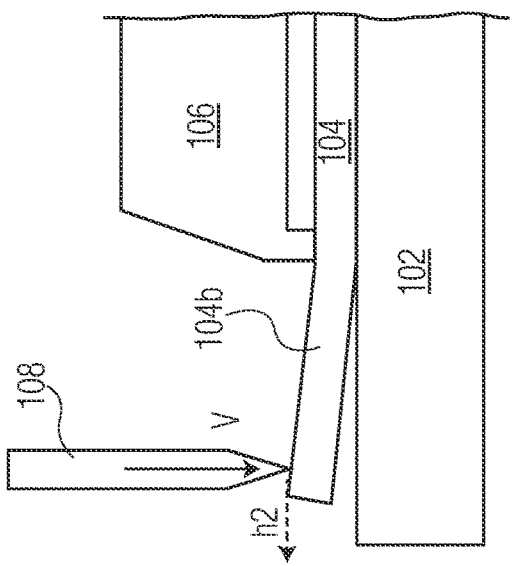
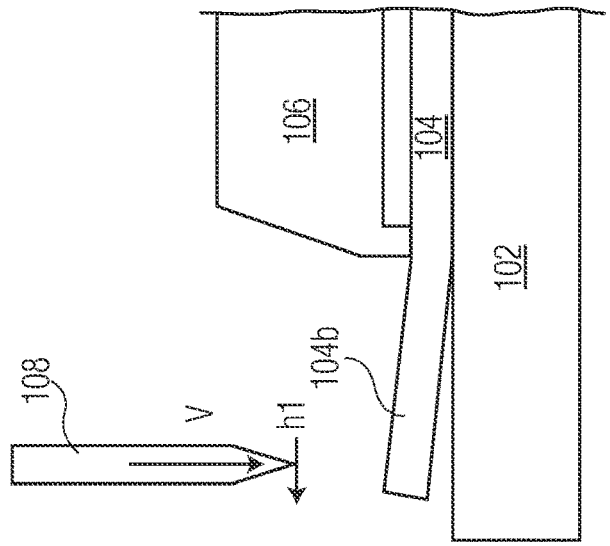

STEP 700: DETECT AN INDICIA OF FLOATING OF THE SEMICONDUCTOR ELEMENT WITH RESPECT TO THE SUPPORT STRUCTURE AT A PLURALITY OF LOCATIONS OF THE SEMICONDUCTOR ELEMENT

STEP 702: ADJUST THE CLAMPING OF THE SEMICONDUCTOR ELEMENT AGAINST THE SUPPORT STRUCTURE BASED ON THE RESULT OF STEP 700

FIG. 7

STEP 800: CLAMP A SEMICONDUCTOR ELEMENT AGAINST A SUPPORT STRUCTURE OF A WIRE BONDING MACHINE AT A PLURALITY OF CLAMPING FORCE VALUES USING A DEVICE CLAMP OF THE WIREBONDING MACHINE

STEP 802: DETECT A FLOATING VALUE OF A PLURALITY OF LOCATIONS OF THE SEMICONDUCTOR ELEMENT AT EACH OF THE PLURALITY OF CLAMPING FORCE PROFILES

STEP 804: DETERMINE, USING DATA DERIVED FROM STEP 802, A DESIRED CLAMPING FORCE PROFILE FOR CLAMPING THE SEMICONDUCTOR ELEMENT ON THE WIRE BONDING MACHINE

FIG. 8

STEP 900: CLAMP A SEMICONDUCTOR ELEMENT AGAINST A SUPPORT STRUCTURE OF A WIRE BONDING MACHINE

STEP 902: DETECT AN INDICIA OF FLOATING OF THE PORTION OF THE SEMICONDUCTOR ELEMENT WITH RESPECT TO THE SUPPORT STRUCTURE

FIG. 9

METHODS OF OPTIMIZING CLAMPING OF A SEMICONDUCTOR ELEMENT AGAINST A SUPPORT STRUCTURE ON A WIRE BONDING MACHINE, AND RELATED METHODS

CROSS-REFERENCE TO RELATED APPLICATION

This application claims the benefit of U.S. Provisional Application No. 63/001,415, filed Mar. 29, 2020, the content of which is incorporated herein by reference.

FIELD

The invention relates to wire bonding operations, and in particular, to techniques for clamping a semiconductor element on a wire bonding machine.

BACKGROUND

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. The primary methods of forming wire loops are ball bonding and wedge bonding. In forming the bonds between (a) the ends of the wire loop and (b) the bond site (e.g., a die pad, a lead, etc.) varying types of bonding energy may be used, including, for example, ultrasonic energy, thermosonic energy, thermocompressive energy, amongst others. Wire bonding machines (e.g., stud bumping machines) are also used to form conductive bumps from portions of wire.

Such wire bonding machines typically include device clamping systems (sometimes referred to as a "device clamp", "clamp insert", "window clamp", etc.) (hereafter referred to as a "device clamp"). The device clamp secures a semiconductor element (e.g., a leadframe including a plurality of semiconductor die) in place against a support structure of the wire bonding machine. In this way, the semiconductor element is ready for a wire bonding operation.

However, sometimes the clamping of the semiconductor element against the support structure is poor. For example, a portion of the semiconductor element may be loosely clamped, or tightly clamped, or both. The operator of the wire bonding machine typically uses trial and error to clamp the semiconductor element against the support structure. This trial and error approach results in deficiencies in the wire bonding operation.

Thus, it would be desirable to provide improved techniques for controlling device clamping on a wire bonding machine.

SUMMARY

According to an exemplary embodiment of the invention, a method of adjusting a clamping of a semiconductor element against a support structure on a wire bonding machine is provided. The method includes: (a) detecting an indicia of floating of the semiconductor element with respect to the support structure at a plurality of locations of the semiconductor element; and (b) adjusting the clamping of the semiconductor element against the support structure based on the results of step (a).

According to another exemplary embodiment of the invention, a method of determining a desired clamping force profile for clamping a semiconductor element on a wire bonding machine is provided. The method includes: (a) clamping a semiconductor element against a support structure of a wire bonding machine at a plurality of clamping force profiles using a device clamp of the wire bonding machine; (b) detecting a floating value of a plurality of locations of the semiconductor element at each of the plurality of clamping force profiles; and (c) determining, using data derived from step (b), a desired clamping force profile for clamping the semiconductor element on the wire bonding machine.

According to yet another exemplary embodiment of the invention, a method of detecting an indicia of floating of a portion of a semiconductor element on a wire bonding machine is provided. The method includes: (a) clamping the semiconductor element against a support structure of a wire bonding machine; and (b) detecting the indicia of floating of the portion of the semiconductor element with respect to the support structure.

The methods of the present invention may also be embodied as an apparatus (e.g., as part of the intelligence of a wire bonding machine), or as computer program instructions on a computer readable carrier (e.g., a computer readable carrier including a wire bonding program used in connection with a wire bonding machine).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 4A-4C are block diagram side views illustrating detection of an indicia of floating of a semiconductor element in accordance with another exemplary embodiment of the invention;

FIGS. 5A-5C are block diagram side views illustrating detection of an indicia of floating of a semiconductor element using a velocity profile in accordance with yet another exemplary embodiment of the invention;

FIG. 7 is a flow diagram illustrating a method of adjusting a clamping of a semiconductor element against a support structure on a wire bonding machine in accordance with an exemplary embodiment of the invention;

FIG. 8 is a flow diagram illustrating a method of determining a desired clamping force profile for clamping a semiconductor element on a wire bonding machine in accordance with an exemplary embodiment of the invention; and FIG. 9 is a flow diagram illustrating a method of detecting an indicia of floating of a portion of a semiconductor element on a wire bonding machine in accordance with an exemplary embodiment of the invention.

DETAILED DESCRIPTION

Figure 1A:
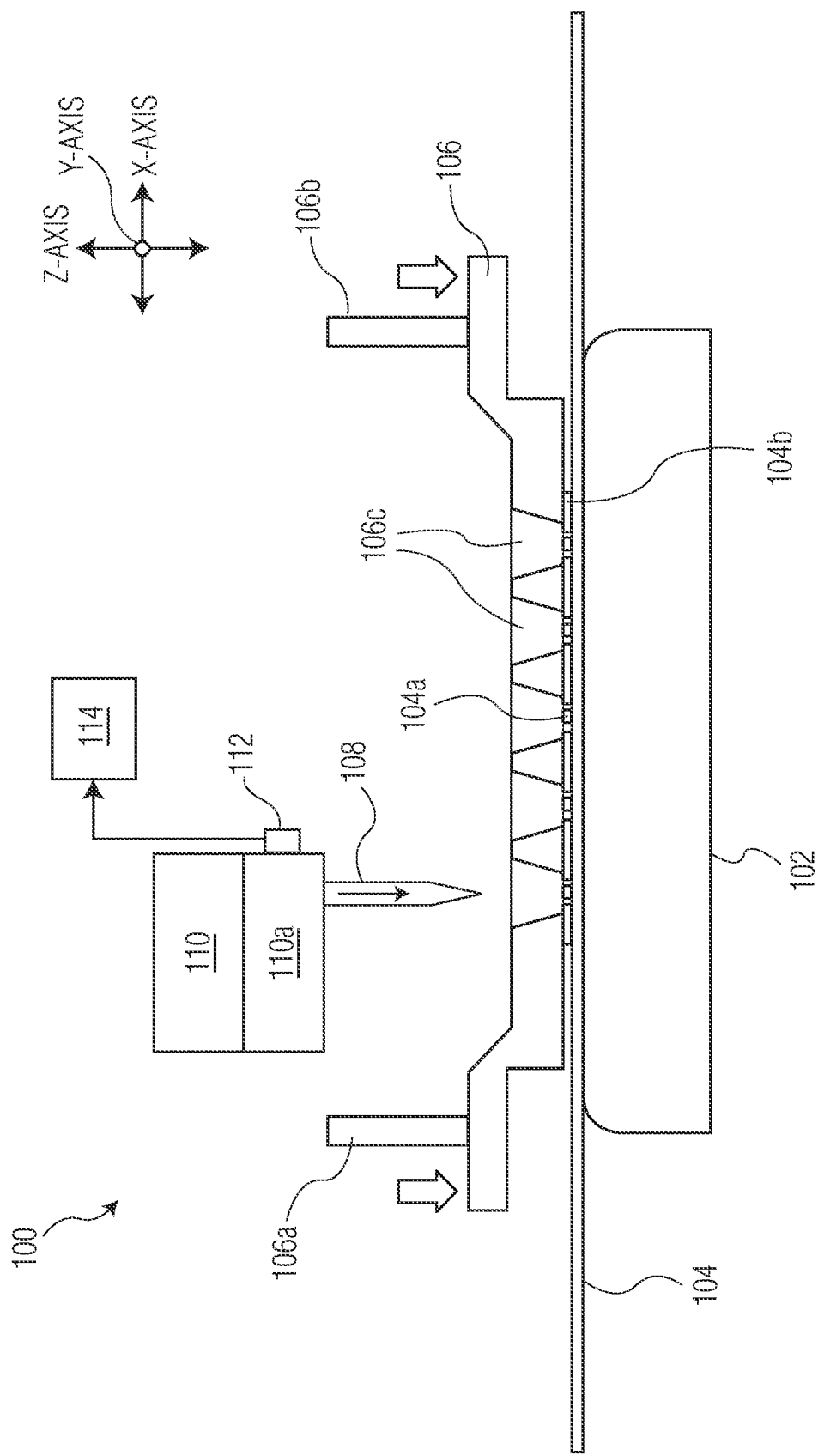
FIG. 1A is a block diagram side view illustrating a wire bonding machine for performing methods in accordance with an exemplary embodiment of the invention.

As used herein, the term "semiconductor element" is intended to refer to any structure including (or configured to include at a later step) a semiconductor chip or die. Exemplary semiconductor elements include a substrate (e.g., a leadframe, a PCB, a carrier, etc.), a substrate carrying one or more semiconductor die, a bare semiconductor die, a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "indicia of floating" is broadly intended to refer to one or more indicium of floating. For example, the indicia of floating may be a simple indication of floating (e.g., a floating condition). For example, such a simple "indication" of floating may be a "no floating" condition, an "acceptable amount of floating" condition, an "excessive floating" condition, etc. That is, in such examples, the actual amount of floating may not be considered. In other examples, the indicia of floating may be a value associated with floating (e.g., an amount of floating between a portion of a semiconductor element and a support structure). That is, the indicia of floating may be related to a distance between (i) a respective portion of the semiconductor element at each of the plurality of locations of the semiconductor element, and (ii) the support structure. For example, the indicia of floating of the semiconductor element with respect to the support structure may be referred to as a floating height measurement.

In accordance with various exemplary embodiments of the invention, semiconductor element clamping techniques are provided including methods of adjusting clamping force, methods of calibrating clamping force (e.g., automatically), monitoring (e.g., real-time) of clamping, methods of monitoring of floating, etc. In connection with such methods, wire bonding machine signals may be used, for example, (i) as feedback to automatically calibrate optimal device clamping force, and/or (ii) as a real time monitor for device clamping and/or an indicia of floating.

Aspects of the invention may be used to provide improved/optimal clamping of a semiconductor element, for example, to achieve desirable wire bonding performance. Further, aspects of the invention may be used to monitor clamping and/or floating of a semiconductor element. Further still, in accordance with aspects of the invention, a warning indication (e.g., a machine alarm, an operator alarm, etc.) may be provided if a floating condition exists (e.g., if an indicium of floating, or a floating value, of a portion of the semiconductor element is not within an acceptable range). The warning may result in an operator checking various machine hardware and functions. For example, such floating conditions may be caused by improper clamping, material problems, substrate problems, machine conditions, among others.

According to certain exemplary embodiments of the invention, a proposed method includes an automatic calibration scheme that will detect a desired (e.g., optimal) clamping force for one or more devices inside a clamping window (i.e., a device clamp, a window clamp, a clamp insert).

Exemplary proposed methods also include a real time method for monitoring any poor clamping condition (and/or floating value or condition) during bonding to prevent yield loss.

Exemplary calibration methods use bonder signals to measure the amount of "floating" at different bonding positions under multiple levels of clamping forces. A desired (e.g., optimal) clamping force is determined (e.g., calculated) based on minimizing the floating amount.

An indicia of floating (e.g., the existence of a floating condition, a floating value, etc.) may also be measured according to aspects of the invention, on a wire bonding machine, independent of closed loop clamping force determinations. The measurement of such floating values may be provided for a number of reasons, including but not limited to: (i) for wire bonding process analysis; (ii) for providing a warning indication (e.g., if the floating value is outside of an acceptable range); (iii) for adjusting (e.g., automatically) at least one bonding parameter of a wire bonding process (e.g., if the floating value is outside of an acceptable range); among others.

In accordance with one specific method of measuring a floating value, a force is applied between a wire bonding tool and the semiconductor element (e.g., a pressing force pressing against a support structure of the wire bonding machine) and a height position (i.e., a first height position) is recorded. Then the force is released (or at least reduced), and when the position signal is settled another height position (e.g., a second height position) is recorded. The delta between these two height positions may be considered the floating value.

In another specific method of measuring a floating value, the applied force is ramped from low to high—and points (e.g., inflection points) on a position curve are observed to derive the floating value.

In another specific method of detecting an indicia of floating, while lowering a wire bonding tool towards a semiconductor element, a time that elapses between a reference height (e.g., a search height) and a contact height/position is measured (while knowing the velocity profile of the wire bonding tool). This time may be referred to as a "CV" time—where CV refers to constant velocity. The contact height is the height at which contact is declared between a wire bonding tool and the semiconductor element. Using the time elapsed and the velocity profile (and/or other signals such as height position signals, etc.), an indicia of floating is detected.

In another specific method of detecting an indicia of floating, a force (e.g., an impact force) is detected while lowering a wire bonding tool to generate a force profile. At contact between the wire bonding tool and the semiconductor element, the force is measured. The measured force is correlated to an indicia of floating (e.g., using predetermined data, etc.).

For exemplary real time monitoring aspects of the invention, an indicia of floating (e.g., the floating value/amount and/or a floating condition) may be monitored at programmed intervals. When a limit is exceeded, a warning or error message will be given to the machine operator. Another option is to automatically trigger a clamp force adjustment and/or calibration to obtain a desired (e.g., optimal) clamp force. Another option is to automatically trigger a bonding parameter adjustment to compensate for an undesirable indicia of floating.

FIG. 1A is a side view of a simplified wire bonding machine 100. Wire bonding machine includes support structure 102 (e.g., a heat block, an anvil, etc.) for supporting a semiconductor element 104 during a wire bonding operation. In the illustrated embodiment of the invention in FIG. 1A, semiconductor element 104 is a leadframe including a plurality of lead fingers 104b. A plurality of semiconductor die 104a (previously placed on the leadframe) are also included in the exemplary semiconductor element 104. Device clamp 106 secures semiconductor element 104 against support structure 102 using a clamping force. Wire bonding machine 100 also includes a plurality of clamp arms 106a, 106b used to move device clamp 106 along a vertical axis of the wire bonding machine 100, and to press device clamp 106 against semiconductor element 104 (and against support structure 102) with a desired amount of clamping (e.g., a desired clamp force, a desired clamp position, etc.). Although two (2) clamp arms 106a, 106b are illustrated in FIG. 1A, any number of clamp arms may be utilized, as desired.

Device clamp 106 defines a plurality of apertures 106c (sometimes only one aperture), through which wire bonding operations may be performed. For example, semiconductor element 104 includes a plurality of semiconductor die 104a, and device clamp 106 defines a plurality of apertures 106c for accessing the plurality of semiconductor die 104a during wire bonding operations.

Figure 1B:
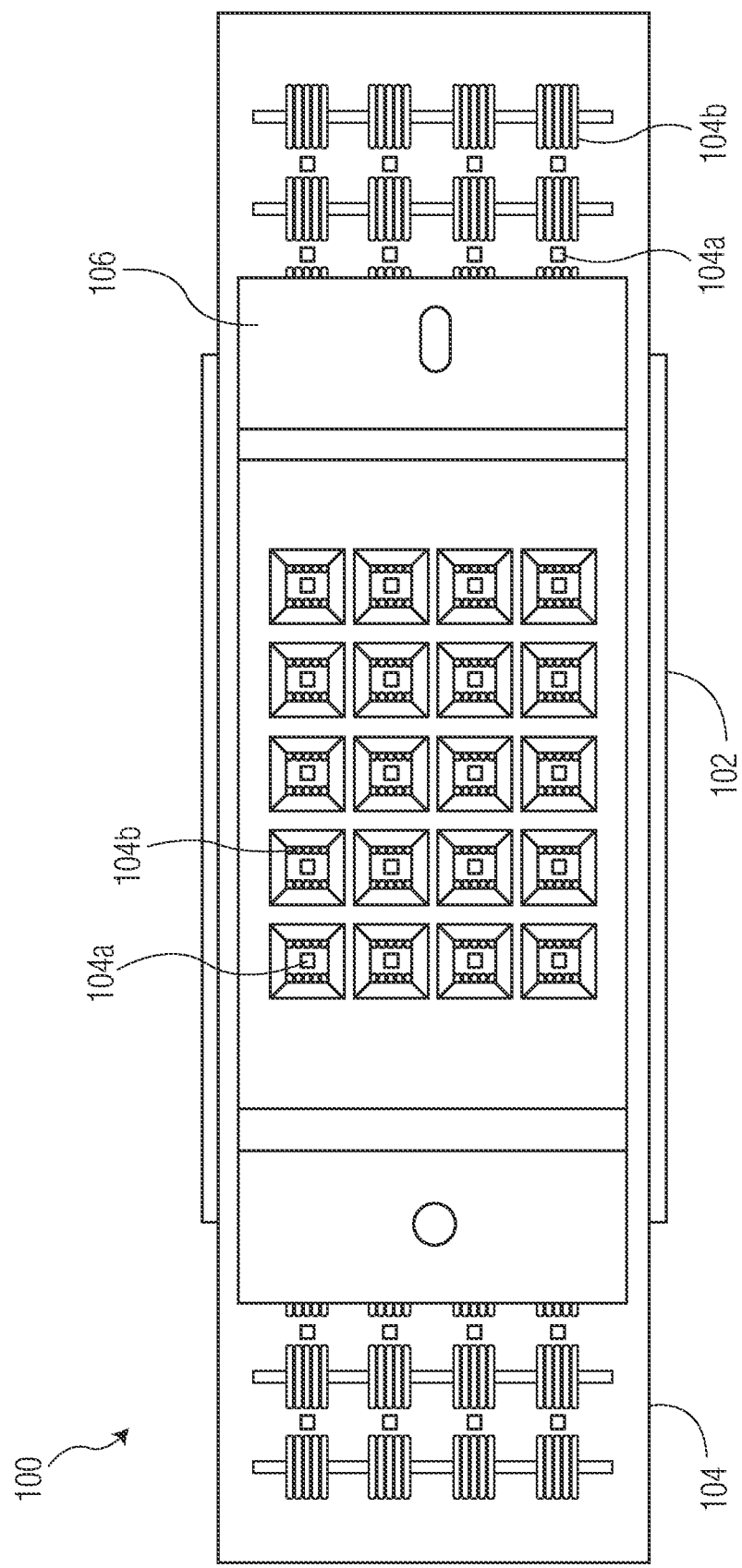
FIG. 1B is a block diagram top view of the wire bonding machine of FIG. 1A.

Wire bonding machine 100 also includes wire bonding tool 108 (e.g., a capillary wire bonding tool, a wedge bonding tool, etc.) for bonding wire portions to semiconductor element 104. As will be appreciated by those skilled in the art, wire bonding tool 108 (carried by bond head assembly 110) is moveable along a plurality of axes of the wire bonding machine 100 to perform wire bonding operations. For example, wire bonding tool 108 is moved along the x-axis and y-axis through movement of bond head assembly 110. A linkage 110a is provided between bond head assembly 110 and wire bonding tool 108. This linkage 110a is configured for movement along the z-axis of the wire bonding machine. A z-axis position detector 112 (e.g., a z-axis encoder) is provided to detect the z-axis position of the linkage (and hence a relative z-axis position of wire bonding tool 108), and provide data corresponding to this z-axis position (e.g., real time) to computer 114 of wire bonding machine 100. Thus, computer 114 has information related to the z-axis position of wire bonding tool 108 through its motions. FIG. 1B is a top view of certain of the elements of wire bonding machine 100.

Figure 2A:
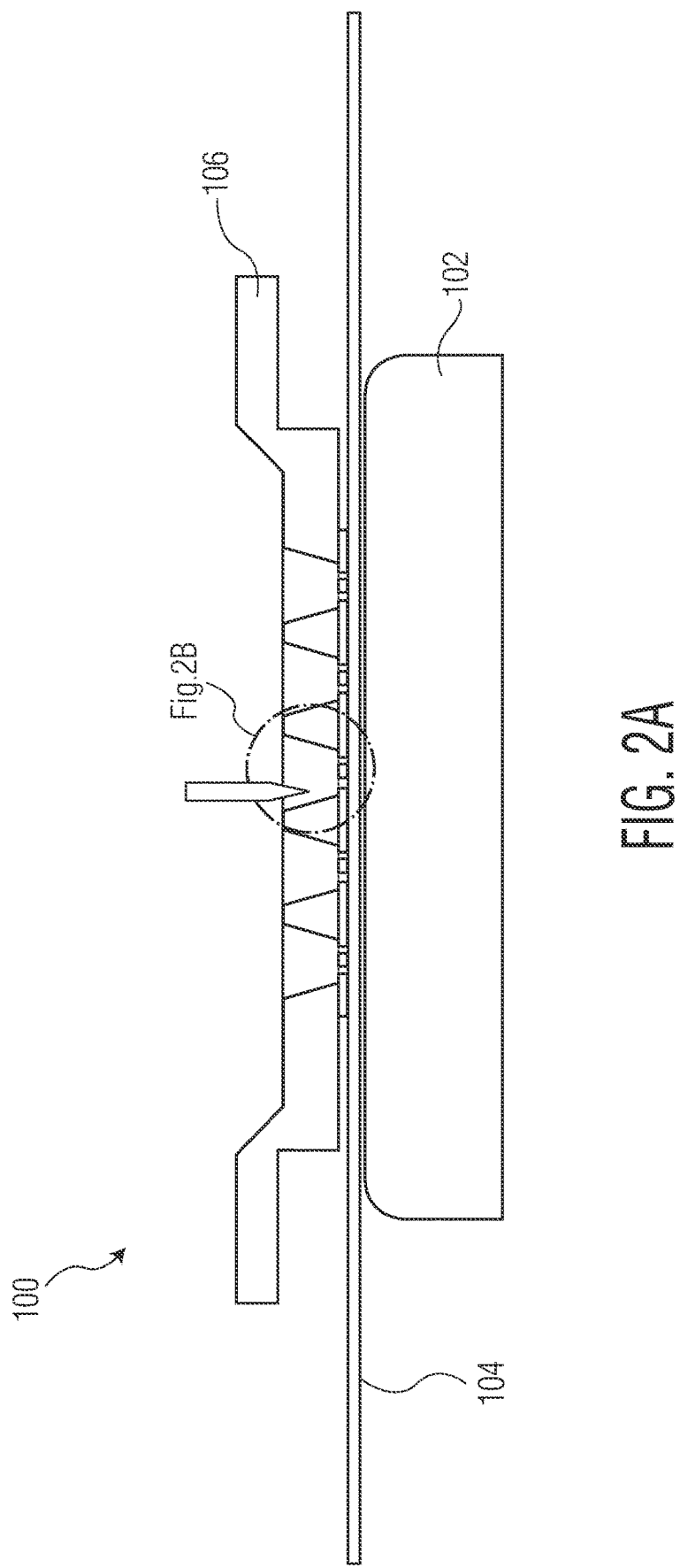
FIGS. 2A-2C are block diagram side views illustrating floating of a semiconductor element to be detected in accordance with an exemplary embodiment of the invention.
Figure 2C:
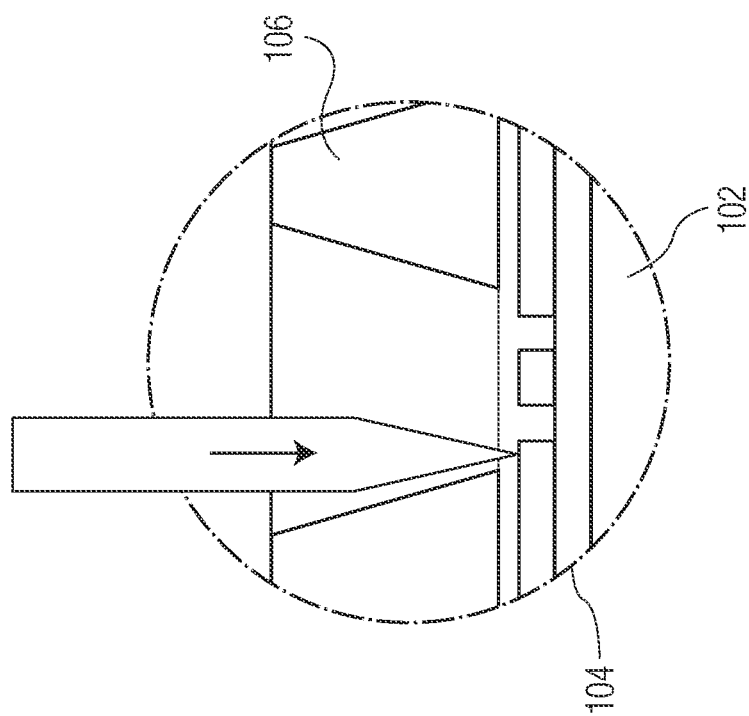
Figure 2B:
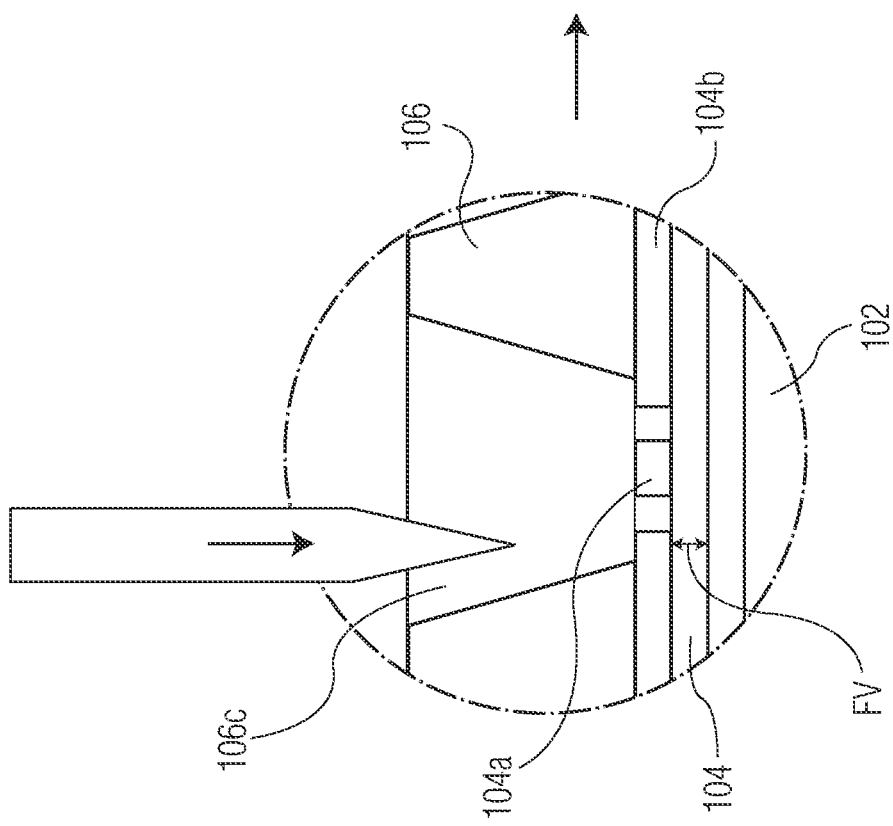

FIG. 2A is a simplified view of a portion of the wire bonding machine 100 of FIGS. 1A-1B. FIG. 2B is detailed view of a portion of FIG. 2A. In FIG. 2B, a portion of semiconductor element 104 not pressed against support structure 102. For example, the clamping of semiconductor element 104 (using device clamp 106) may include too much clamping force, thus creating a "bubble" where semiconductor element 104 is not pressed against support structure 102, as shown in FIG. 2B. The separation between the lower surface of semiconductor element 104 and the upper surface of support structure 102 may be referred to as a "floating value," and is labelled in FIG. 2B as "FV". In FIG. 2C, wire bonding tool 108 has been lowered to press that portion of semiconductor element 104 downward, such that it now contacts support structure 102. This type of operation (shown in FIGS. 2B-2C) may be useful in connection with the invention, as will be explained in greater detail with respect to FIGS. 3A-3C, FIGS. 4A-4C, FIGS. 5A-5C, and FIGS. 6A-6C.

Figure 3A:
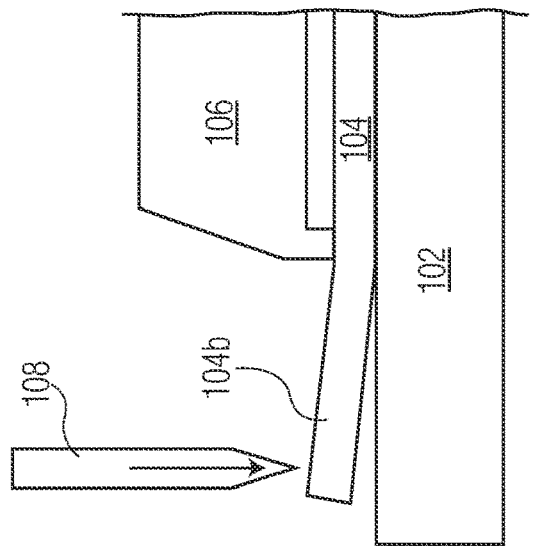
FIGS. 3A-3C are block diagram side views illustrating detection of an indicia of floating of a semiconductor element in accordance with an exemplary embodiment of the invention.
Figure 3B:
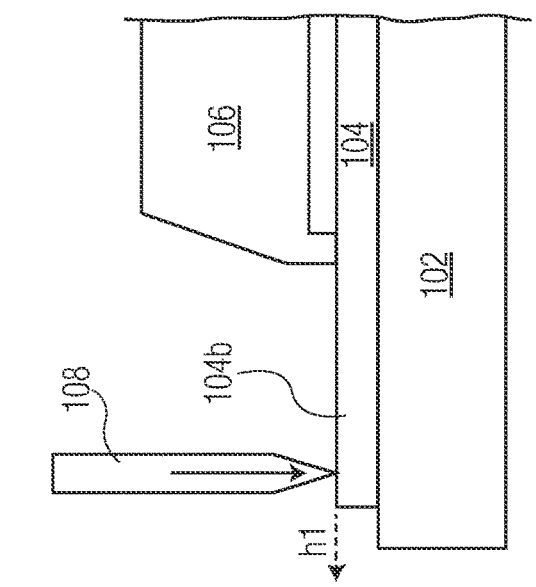
Figure 3C:
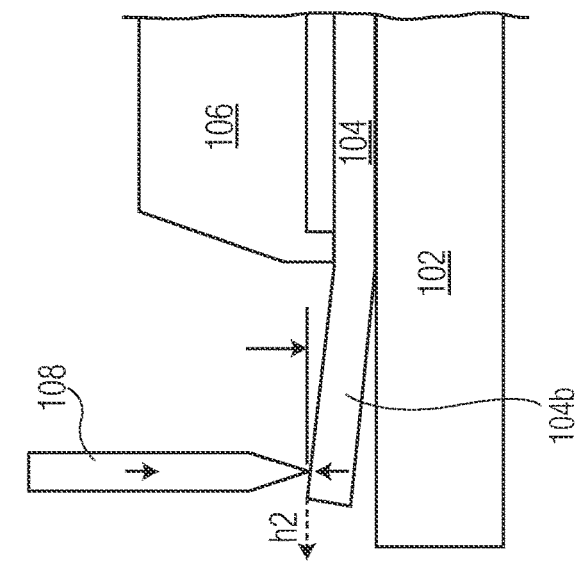

FIGS. 3A-3C illustrate a method of detecting a floating value of a portion of a semiconductor element 104. Referring now to FIG. 3A, a portion 104b of a semiconductor element 104 (i.e., where portion 104b is a bonding portion such as a lead) is "floating" with respect to support structure 102. In order to detect the amount of floating (sometimes referred to as a floating value, or an indicia of floating), at FIG. 3B the floating portion of semiconductor element 104 is pressed against support structure 102 using a pressing force applied using wire bonding tool 108. At this position, the z-axis height is known (see z-axis position detector 112, and computer 114, from FIG. 1A). This height is shown as "h1" in FIG. 3B. At FIG. 3C, at least a portion of the pressing force is reduced to allow the previously floating portion of semiconductor element 104 to return to its floating position (a "neutral height"). At this position, the z-axis height is known (see z-axis position detector 112, and computer 114, from FIG. 1A). This height is shown as "h2" in FIG. 3C. In this example, the floating value may be calculated using h2 and h1 (e.g., the floating value is h2 minus h1).

FIGS. 4A-4C illustrate another method of detecting a floating value of a portion of a semiconductor element 104. Referring now to FIG. 4A, a portion 104b of a semiconductor element 104 (i.e., where portion 104b is a bonding portion such as a lead) is "floating" with respect to support structure 102. In order to detect the amount of floating (sometimes referred to as a floating value, or an indicia of floating), at FIG. 3B the floating portion of semiconductor element 104 is contacted by wire bonding tool 108. This contact is detected using any of a number of techniques (e.g., constant velocity detection of wire bonding tool 108, position detection of wire bonding tool 108, motor current detection of the z-axis motor driving wire bonding tool 108, among others). In any event, the z-axis height at the contact of FIG. 4B is known (see z-axis position detector 112, and computer 114, from FIG. 1A). This height is shown as "h1" in FIG. 4B. At FIG. 4C, the floating portion of semiconductor element 104 is pressed against support structure 102 using a pressing force applied using wire bonding tool 108. At this position, the z-axis height is known (see z-axis position detector 112, and computer 114, from FIG. 1A). This height is shown as "h2" in FIG. 4C. In this example, the floating value may be calculated using h2 and h1 (e.g., the floating value is h1 minus h2).

FIGS. 5A-5C illustrate a method of detecting an indicia of floating of a portion 104b of a semiconductor element 104 using a wire bonding tool 108. Referring now to FIG. 5A, portion 104b of semiconductor element 104 (i.e., where portion 104b may be a bonding portion of semiconductor element 104 such as a lead) is "floating" with respect to support structure 102. At FIG. 5A, wire bonding tool 108 is at a predetermined height h1 (e.g., sometimes referred to as a "search height" or a "reference height" or "tip height"). That is, predetermined height h1 is a known position (e.g., a relative position) on the wire bonding machine. At a time T1 (the time shown in FIG. 5A), wire bonding tool 108 begins to be lowered toward semiconductor element 104 at a velocity profile V. At FIG. 5B, at a time T2, wire bonding tool 108 (still travelling at velocity profile V) makes initial contact with portion 104b of semiconductor element 104 at height h2 (i.e., initial contact height h2). This initial contact may be detected, for example, using an electrical continuity detection process such as a "BITS" process. That is, in connection with wire bonding, it is often desirable to confirm that a portion of wire is properly bonded to a bonding location. Wire bonding machines marketed by Kulicke and Soffa Industries, Inc. often utilize such a "BITS" process (i.e., bond integrity test system) to confirm that proper wire bonds have been formed. International Patent Application Publication WO 2009/002345, which is incorporated by reference herein in its entirety, illustrates exemplary details of such processes and related systems. Such a BITS process may be used to detect the initial contact shown in FIG. 5B. Of course, other methods may be used to detect the initial contact such as a force and/or position based method.

At FIG. 5C, wire bonding tool 108 (still travelling at velocity profile V) has continued moving downward to height h3 where at a time T3 contact has been declared between wire bonding tool 108 and semiconductor element 104. The declaration of contact may be made, for example, using a predetermined change in the velocity (i.e., changes caused by the contact). Other criteria may also be used to declare contact between wire bonding tool 108 and semiconductor element 104.

At this position (i.e., at height h3, with contact being declared), a time has elapsed between T3-T1. That is, the time between (i) when wire bonding tool 108 starts to descend in FIG. 5A and (ii) when contact is declared between wire bonding tool 108 and semiconductor element 104 in FIG. 5C. In other embodiments of the invention, another elapsed time such as the time between T3-T2, or the time between T2-T1, may be utilized.

During the lowering of wire bonding tool 108 towards semiconductor element 104 shown in FIGS. 5A-5C, the velocity profile V of wire bonding tool is known. For example, wire bonding tool 108 may travel at a constant velocity (e.g., "CV") profile between h1-h3, or at some other velocity profile. In any event, by knowing the time elapsed between T3-T1 (or another elapsed time such as T3-T2 or T2-T1), and the velocity profile V, the indicia of floating may be determined. For example, the indicia of floating may be a simple indication of floating. For example, such a simple "indication" of floating may be a "no floating" condition, an "acceptable amount of floating" condition, an "excessive floating" condition, etc. In other examples, the indicia of floating may be a value associated with floating (e.g., an amount of floating between the portion 104b and support structure 102, or see "FV" shown in FIG. 2B, etc.). That is, with information including time values (e.g., T1, T2, T3), position values (e.g., h1, h2, h3), and the velocity profile—along with a computer on a wire bonding machine (e.g., see computer 114 in FIG. 1A)—a floating value may be calculated.

Figure 6C:
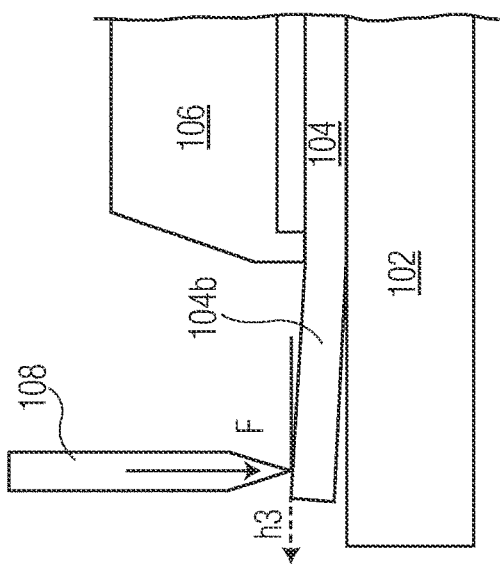
FIGS. 6A-6C are block diagram side views illustrating detection of an indicia of floating of a semiconductor element using a force profile in accordance with yet another exemplary embodiment of the invention.
Figure 6B:
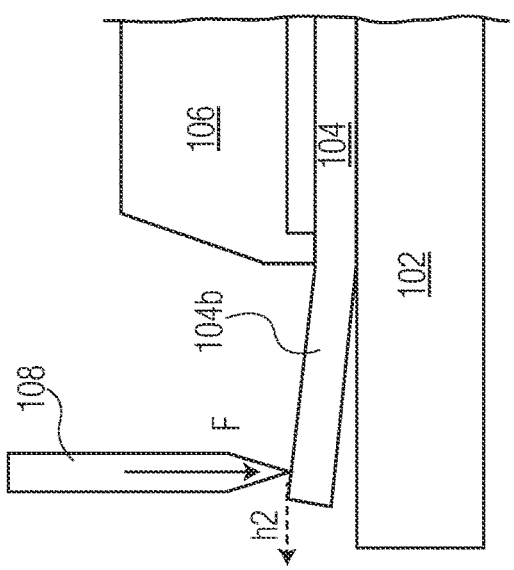
Figure 6A:
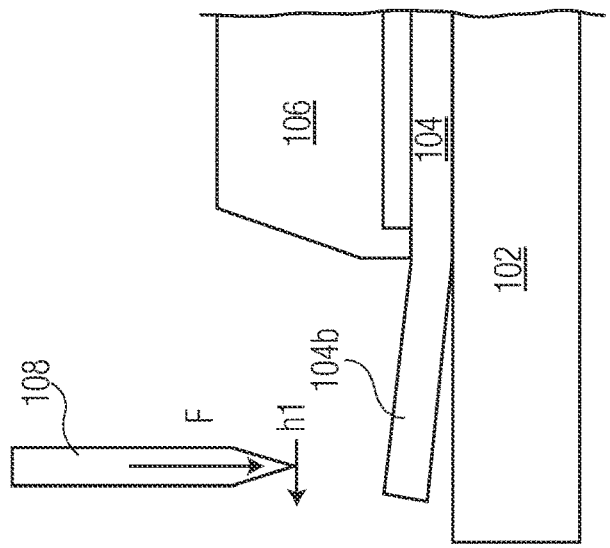

FIGS. 6A-6C illustrate another method of detecting an indicia of floating of a portion 104b of a semiconductor element 104 using a wire bonding tool 108. Referring now to FIG. 6A, portion 104b of semiconductor element 104 (i.e., where portion 104b may be a bonding portion of semiconductor element 104 such as a lead) is "floating" with respect to support structure 102. At FIG. 6A, wire bonding tool 108 is at a predetermined height h1 (e.g., sometimes referred to as a "search height" or a "reference height"). That is, predetermined height h1 is a known position (e.g., a relative position) on the wire bonding machine. At a time T1 (the time shown in FIG. 6A), wire bonding tool 108 begins to be lowered toward semiconductor element 104. While lowering wire bonding tool 108, a force (e.g., an impact force, measured using a force sensor in the bond head assembly of the wire bonding machine) is monitored (e.g., to generate a force profile including at least one force measurement). At FIG. 6B, at a time T2, wire bonding tool 108 (e.g., still monitoring the force using a force sensor) makes initial contact with portion 104b of semiconductor element 104 at height h2 (i.e., initial contact height h2). This initial contact may be detected, for example, using an electrical continuity detection process such as a "BITS" process. Of course, other methods may be used to detect the initial contact such as a force and/or position based method.

At FIG. 6C, wire bonding tool 108 (e.g., still monitoring the force using a force sensor) has continued moving downward to height h3 where at a time T3 contact has been declared between wire bonding tool 108 and semiconductor element 104. The declaration of contact may be made, for example, using a change detected using the force sensor. Of course, other methods of declaring the contact may be used.

At this position (i.e., at height h3, with contact being declared), and with the force measurements monitored using the force sensor, an indicia of floating may be known (e.g., by correlating a measured force to an indicia of floating). For example, the indicia of floating may be a simple indication of floating. For example, such a simple "indication" of floating may be a "no floating" condition, an "acceptable amount of floating" condition, an "excessive floating" condition, etc. In other examples, the indicia of floating may be a value associated with floating (e.g., an amount of floating between the portion 104b and support structure 102, or see "FV" shown in FIG. 2B, etc.). That is, with information including time values (e.g., T1, T2, T3), position values (e.g., h1, h2, h3), and the measured force profile (e.g., one or more force values detected such as at T1, T2, and T3)—along with a computer on a wire bonding machine (e.g., see computer 114 in FIG. 1A)—a floating value may be calculated.

FIGS. 7-9 are flow diagrams illustrating exemplary methods in accordance with the invention. As is understood by those skilled in the art, certain steps included in the flow diagrams may be omitted; certain additional steps may be added; and the order of the steps may be altered from the order illustrated—all within the scope of the invention.

FIG. 7 is a flow diagram illustrating a method of adjusting a clamping of a semiconductor element against a support structure on a wire bonding machine. For example, this method may be performed as part of a set-up of a wire bonding operation. In another example, this method may be repeated at a predetermined interval (e.g., a time interval, a production interval such as number of wire bonds or number of devices processed, etc.).

At Step 700, an indicia of floating of the semiconductor element with respect to the support structure is detected at a plurality of locations of the semiconductor element. The indicia of floating may be related to a distance between (i) a respective portion of the semiconductor element at each of the plurality of locations of the semiconductor element, and (ii) the support structure.

For example, the indicia of floating of the semiconductor element with respect to the support structure is a floating height measurement. In such an example, the step of detecting the floating height measurement may include: pressing a respective portion of the semiconductor element against the support structure using a pressing force applied using a wire bonding tool of the wire bonding machine (such as shown in FIG. 3B); and releasing at least a portion of the pressing force to detect the floating height measurement at the respective one of the plurality of locations of the semiconductor element (such as shown in FIG. 3C). For example, a z-axis encoder (such as z-axis position detector 112) is used in connection with the detection of the floating height measurement.

In another example of Step 700, the indicia of floating of the semiconductor element with respect to the support structure is a different floating height measurement. In such an example, the step of detecting the floating height measurement may include: during lowering of a wire bonding tool of the wire bonding machine, detecting contact between a respective portion of the semiconductor element and a wire bonding tool (such as shown in FIG. 4B); continuing to lower the wire bonding tool while detecting pressing of the respective portion of the semiconductor element against the support structure (such as shown in FIG. 4C), and detecting the floating height measurement at the respective portion of the semiconductor element using position information retrieved during the prior steps. For example, a z-axis encoder (such as z-axis position detector 112) is used in connection with the detection of the floating height measurement.

At Step 702, the clamping of the semiconductor element against the support structure is adjusted based on the results of Step 700. This adjustment may vary considerably.

For example, the adjustment at Step 702 may be to adjust the clamping by the device clamp. For example, if the device clamp includes a plurality of clamp arms, Step 702 may include making an adjustment to at least one of the clamp arms. Such an adjustment may be a clamping force adjustment provided by the at least one of the clamp arms, and/or a position adjustment of the at least one of the clamp arms.

For example, the adjustment at Step 702 may be to change the device clamp (with a different device clamp) of the wire bonding machine. That is, the method of FIG. 5 may be used to determine which device clamp (sometimes referred to as a p-part) is most suited for a given wire bonding application.

FIG. 8 is a flow diagram illustrating a method of determining a desired clamping force profile for clamping a semiconductor element on a wire bonding machine. For example, this method may be performed as part of a set-up of a wire bonding operation. In another example, this method may be repeated at a predetermined interval (e.g., a time interval, a production interval such as number of wire bonds or number of devices processed, etc.).

At Step 800, a semiconductor element is clamped against a support structure of a wire bonding machine at a plurality of clamping force profiles using a device clamp of the wire bonding machine. At Step 802, a floating value of a plurality of locations of the semiconductor element is detected at each of the plurality of clamping force profiles. For example, the floating value (e.g., "FV" shown in FIG. 2B) is related to a distance between (i) a respective portion of the semiconductor element at each of the plurality of locations of the semiconductor element, and (ii) the support structure.

For example, the step of detecting the floating value (at Step 802) may include: pressing a respective portion of the semiconductor element against the support structure using a pressing force applied using a wire bonding tool of the wire bonding machine (such as shown in FIG. 3B); and releasing at least a portion of the pressing force to detect the floating height measurement at the respective one of the plurality of locations of the semiconductor element (such as shown in FIG. 3C). For example, a z-axis encoder (such as z-axis position detector 112) is used in connection with the detection of the floating value.

In another example of Step 802, the step of detecting the floating value may include: during lowering of a wire bonding tool of the wire bonding machine, detecting contact between a respective portion of the semiconductor element and a wire bonding tool (such as shown in FIG. 4B); continuing to lower the wire bonding tool while detecting pressing of the respective portion of the semiconductor element against the support structure (such as shown in FIG. 4C), and detecting the floating value at the respective portion of the semiconductor element using position information retrieved during the prior steps. For example, a z-axis encoder (such as z-axis position detector 112) is used in connection with the detection of the floating value.

At Step 804, using data derived from Step 802, a desired clamping force profile is determined for clamping the semiconductor element on the wire bonding machine.

The desired clamping force profile determined in Step 804 may be relatively simple, such as a fixed amount of force applied by each clamp arm continuously. Alternatively, the clamp force profile may apply a different amount of force (and/or a different z-axis position) for each clamp arms. Further still, the clamp force profile may be a time based profile, that is, the force applied by each of the clamp arms, and/or the z-axis position of each of the clamp arms, or other conditions which may be controlled, may be varied over time.

FIG. 9 is a flow diagram illustrating a method of detecting an indicia of floating of a portion of a semiconductor element on a wire bonding machine. At Step 900, a semiconductor element is clamped against a support structure of the wire bonding machine. At Step 902, an indicia of floating of the portion of the semiconductor element is detected with respect to the support structure. For example, Step 902 may utilize methods described in connection with FIGS. 5A-5C, FIGS. 6A-6C, other methods described herein, and other methods within the scope of the invention.

Although the invention is illustrated and described largely with respect to use of wire bonding tool 108 without wire (e.g., a free air ball, or a length of wire), it is not limited thereto. For example, aspects of the invention (e.g., detecting an indicia of floating or a floating values, as in FIGS. 7-9) may be applied to wire looping operations.

For example, by detecting floating values (e.g., using a wire bonding tool with, or without, a portion of wire such as a free air ball), during formation of conductive bumps on a wire bonding machine, a desirable height for bump forming operations may be achieved (e.g., bump forming parameters may be varied in consideration of floating). Such bump forming operations include smoothing operations, etc.

In another example, by detecting floating values (e.g., using a wire bonding tool with, or without, a portion of wire such as a free air ball), during formation of wire loops, a desirable wire loop height may be programmed (e.g., looping parameters may be varied in consideration of floating).

Exemplary results provided by the invention overcome a lack of closed loop optimization and detection in the industry today. According to certain exemplary embodiments of the invention, new closed loop optimization methods, and real time monitoring methods, related to the device clamping condition are provided.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of adjusting a clamping of a semiconductor element against a support structure on a wire bonding machine using a plurality of clamp arms, the method comprising the steps of:
(a) detecting an indicia of floating of the semiconductor element with respect to the support structure at a plurality of locations of the semiconductor element; and
(b) adjusting the clamping of the semiconductor element against the support structure based on the results of step (a) according to a clamping force profile, the clamping force profile applying at least one of (i) a different amount of force for each of the plurality of clamp arms, and (ii) a different z-axis position for each of the plurality of clamp arms.

2. The method of claim 1 wherein steps (a) and (b) are performed as part of a set-up of a wire bonding operation.

3. The method of claim 1 wherein steps (a) and (b) are repeated at a predetermined interval in connection with a wire bonding operation.

4. The method of claim 1 wherein the clamping of the semiconductor element against the support structure is provided by a device clamp, and wherein step (b) includes adjusting clamping by the device clamp.

5. The method of claim 1 wherein the indicia of floating of the semiconductor element with respect to the support structure is a floating height measurement, and wherein step (a) includes (a1) pressing a respective portion of the semiconductor element against the support structure using a pressing force applied using a wire bonding tool of the wire bonding machine, and (a2) releasing at least a portion of the pressing force to detect the floating height measurement at the respective one of the plurality of locations of the semiconductor element.

6. The method of claim 5 wherein at step (a2) a reduced pressing force is applied to the respective portion of the semiconductor element while detecting the floating height measurement at the respective one of the plurality of locations of the semiconductor element, the reduced pressing force being less than the pressing force.

7. The method of claim 1 wherein the indicia of floating of the semiconductor element with respect to the support structure is a floating height measurement, and wherein step (a) includes (a1) during lowering of a wire bonding tool of the wire bonding machine, detecting contact between a respective portion of the semiconductor element and a wire bonding tool, (a2) continuing to lower the wire bonding tool while detecting pressing of the respective portion of the semiconductor element against the support structure, and (a3) detecting the floating height measurement at the respective portion of the semiconductor element using position information retrieved during step (a1) and step (a2).

8. The method of claim 1 wherein the indicia of floating is related to a distance between (i) a respective portion of the semiconductor element at each of the plurality of locations of the semiconductor element, and (ii) the support structure.

9. A method of determining a desired clamping force profile for clamping a semiconductor element on a wire bonding machine, the method comprising the steps of:
(a) clamping a semiconductor element against a support structure of a wire bonding machine at a plurality of clamping force profiles using a device clamp of the wire bonding machine, the device clamp including a plurality of clamp arms;
(b) detecting a floating value of a plurality of locations of the semiconductor element at each of the plurality of clamping force profiles; and
(c) determining, using data derived from step (b), a desired clamping force profile for clamping the semiconductor element on the wire bonding machine, the desired clamping force profile applying at least one of (i) a different amount of force for each of the plurality of clamp arms, and (ii) a different z-axis position for each of the plurality of clamp arms.

10. The method of claim 9 wherein the semiconductor element includes a plurality of semiconductor die, and the device clamp defines a plurality of apertures for accessing the plurality of semiconductor die during a wire bonding operation.

11. The method of claim 9 wherein step (b) includes (b1) pressing a respective portion of the semiconductor element against the support structure using a pressing force applied using a wire bonding tool of the wire bonding machine, and (b2) releasing at least a portion of the pressing force to detect the floating value at the respective one of the plurality of locations of the semiconductor element.

12. The method of claim 11 wherein at step (b2) a reduced pressing force is applied to the respective portion of the semiconductor element while detecting the floating value at the respective one of the plurality of locations of the semiconductor element, the reduced pressing force being less than the pressing force.

13. The method of claim 9 wherein step (a) includes (a1) lowering a wire bonding tool of the wire bonding machine and detecting contact between a respective portion of the semiconductor element and a wire bonding tool, (a2) continuing to lower the wire bonding tool until detecting pressing of the respective portion of the semiconductor element against the support structure, and (a3) detecting the floating value at the respective portion of the semiconductor element using position information retrieved during step (a1) and step (a2).

14. The method of claim 9 wherein the floating value is related to a distance between (i) a respective portion of the semiconductor element at each of the plurality of locations of the semiconductor element, and (ii) the support structure.

* * * * *